TRANSISTOR AMPLIFIER HAVING EMITTER BYPASS
THROUGH AN AUXILIARY TRANSISTOR

Filed Aug. 26, 1968

INVENTORS
DONALD H. MONTGOMERY &
JOEL R. OBERMAN
BY H. Christoffersen
ATTORNEY

United States Patent Office 3,524,141

Patented Aug. 11, 1970

3,524,141

TRANSISTOR AMPLIFIER HAVING EMITTER BYPASS THROUGH AN AUXILIARY TRANSISTOR

Donald H. Montgomery, Woodbury, and Joel R. Oberman, Cinnaminson, N.J., assignors to RCA Corporation, a corporation of Delaware Filed Aug. 26, 1968, Ser. No. 755,048
Int. Cl. H03f 3/04
U.S. Cl. 330—22 8 Claims

ABSTRACT OF THE DISCLOSURE

High gain, wide band, single-ended amplifier having no bypass capacitor. The amplifier includes a pair of emitter coupled transistors with input signals applied across their base leads. Operating power means provide A.C. ground conditions at the base and collector leads of one of the transistors and the output is taken from the collector of the other transistor. The emitter-to-base junction and the emitter-to-collector path of the one transistor provide a low impedance path to ground for signals well as degenerate feedback for A.C. stability.

BACKGROUND OF INVENTION

The present invention relates to amplifiers and in particular to single-ended amplifiers. In some applications, for example, memory sensing systems, single-ended amplifiers are required to amplify relatively small input signals with high gain over a wide band. In the past, this requirement has been accomplished by employing a bypass capacitor, as in the emitter circuit of a common emitter transistor amplifier. Although the bypass capacitor is suitable for some applications, it is inadequate in others where the R–C time constant in the emitter circuit is larger than the signal repetition rate such that certain types of information signals, which have a net D.C. average voltage, build up a charge across the bypass capacitor which causes the bias level to shift. If the bias level shifts too much, the amplifier fails to detect the input signal.

An object of the invention is to provide a novel and improved high gain and wide band single-ended amplifier which has no bypass capacitor.

BRIEF SUMMARY

In brief, an amplifier according to the present invention includes a pair of transistors having their emitter leads connected to a source of current and their base leads connected to receive input signals thereacross. A collector impedance connects the collector lead of one of the transistors to operating power means. The operating power means also includes means for providing A.C. ground conditions at the base and collector leads of the other transistor, whereby the emitter-to-base junction and emitter-to-collector path of the other transistor provide a relatively low impedance path to ground for time varying signals.

BRIEF DESCRIPTION OF DRAWINGS

In the drawings, like reference characters denote like components, and.

Figure 1:
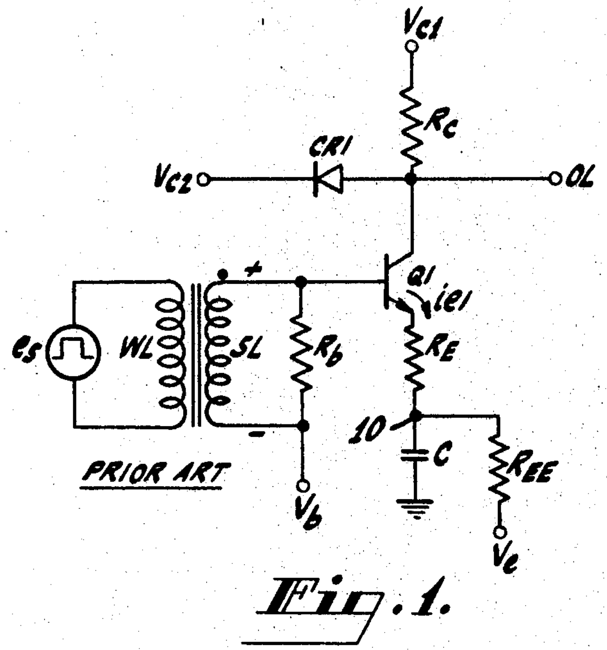
FIG. 1 is a schematic circuit diagram of a prior art, single-ended amplifier employing a bypass capacitor.

Referring initially to FIG. 1, there is shown a prior art single-ended common emitter amplifier including transistor Q1, collector resistor $R_C$, clamping diode CR1, emitter resistors $R_E$ and $R_{EE}$ and a bypass capacitor C. The transistor Q1 is biased in the linear or active region by means of the operating power supply means designated $V_{c1}$, $V_e$ and $V_b$. The clamping diode CR1 is connected to receive a clamping voltage $V_{c2}$. The various voltages $V_{c1}$, $V_{c2}$, $V_e$ and $V_b$ may be derived from any suitable power supply and each such voltage is assumed to bypass information signals to the ground reference by appropriate bypass capacitors (not shown). The relative values of the bias voltages are such that $V_{c1}$ is more positive than the ground reference, $V_b$ is more negative than the ground reference, $V_e$ is more negative than $V_b$ and $C_{c2}$ is more positive than $V_b$, such that the following order prevails $$V_{c1} > V_{c2} > V_b > V_e$$

The $V_e$ supply and emitter resistor $R_{EE}$ provide a substantially constant D.C. emitter current designated as $i_{e1}$ by the arrow adjacent the emitter lead of transistor Q1, the arrow being in the direction of conventional current flow. The resistor $R_E$ is relatively smaller than $R_{EE}$ in value and provides degenerate feedback for A.C. stability ofthe transistor amplifier.

Although the input signal source for the transistor amplifier may take different forms for different applications, it is here shown as a transformer which simulates one bit of a read-only memory (ROM) application. The core material of the transformer is thus considered to be magnetic material shaped to have a pair of closed flux paths each linked with the same orientation by a sense winding SL corresponding to the transformer secondary. Stored binary information is represented by a word line WL, corresponding to the transformer primary, which links one of the flux paths with one orientation to store a binary "1" or which links the other flux path with an opposite orientation to store a binary "0." The word line WL, of course, links the other bit transformers in the array which comprise a word. The word line WL is driven by a word driver or signal source designated $e_s$.

The word driver is selectively operable during the operating cycle of the machine in which it is employed to apply the signal $e_s$ to the word line WL. For the purpose of the following description, a WL orientation for "1" bit storage will be assumed to respond to the signal $e_s$ to cause a current to flow out of the dotted end of the secondary sense coil SL and to induce a voltage having the relative polarity as indicated adjacent the secondary SL. On the other hand, a WL orientation for "0" bit storage will respond to signal $e_s$ to cause a current to flow into the dotted end of the secondary sense winding SL and to induce a voltage having a relative polarity opposite to that illustrated.

These induced signals are time varying or A.C. signals and are hereinafter referred to as input signals to the transistor amplifier. In the description which follows, the terms "time varying signals," "A.C. signals," "small signals," and "information signals" will be used interchangeably as meaning any signal which varies with time at any designated point in the amplifier circuit regardless of the D.C. voltage level at such circuit point.

The resistor $R_b$ connected across the sense line secondary SL is a terminating impedance for the sense line for damping out oscillations in the word line primary WL, and, as such is matched to the input impedance $Z_{in}$ of the transistor amplifier Q1.

The transistor amplifier amplifies the induced input signals and translates them to its output lead OL in a linear or class A mode. A problem arises for relatively rapid signal repetition rates when the induced input signals have a net D.C. average voltage. For example, consider that a string or series of "1" bits are read out of the same bit location or transformer in the ROM. This results in a series of positive going input signals applied to the base lead of transistor Q1. Ordinarily, the bypass capacitor C acts to bypass the signal voltage at point 10 to ground. However, this action involves an RC time constant of $R_{EE}C$ for each signal. Because $R_{EE}$ must be large enough to provide a proper standby emitter current $i_{e1}$, the time constant $R_{EE}C$ can be relatively large, on the order of 22 microseconds, as compared to the signal repetition rate, which for one application is about 920 nanoseconds. That is, a signal occurs at 920 nanosecond intervals or just slightly less than one microsecond intervals. Consequently, slightly more than 22 signals can occur during the $R_{EE}C$ time constant period. If the numbers of "1" and "0" signals are unequal, there is a net D.C. average which causes a voltage to build up across the bypass capacitor and hence causes the bias level to shift. If the number of "1" signals exceeds the number of "0" signals, the point 10 becomes more positive, tending to cut the transistor Q1 off. On the other hand, if the number of "0" signals exceeds the number of "1" signals, the point 10 becomes more negative, tending to bias the transistor Q1 toward saturation. If the bias level shifts too much, the amplifier either fails to detect the input signal or saturates.

Figure 2:
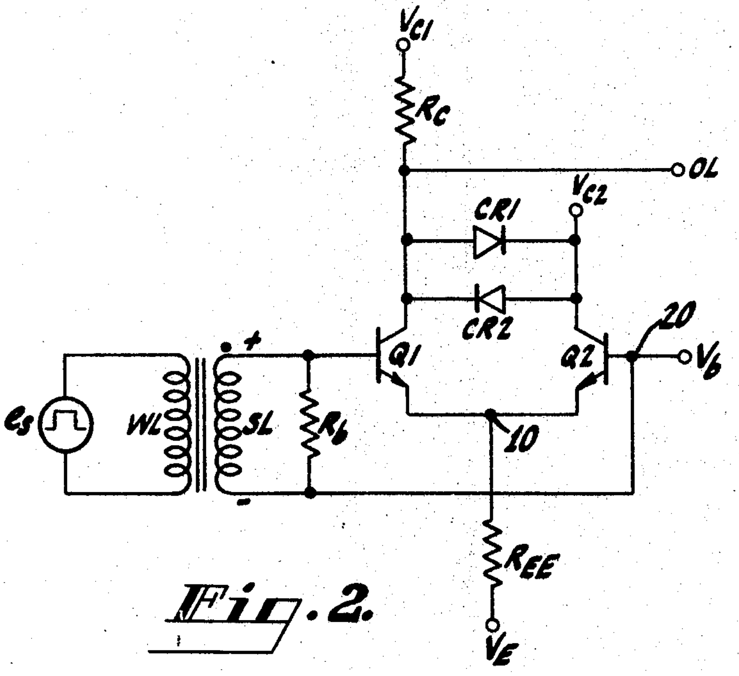
FIG. 2 is a schematic circuit diagram of a single-ended amplifier according to the present invention.

The circuit of the present invention avoids this problem by omitting the bypass capacitor and the A.C. stability resistor $R_E$ and in lieu thereof providing a relatively low impedance (on the order of 8 ohms or so) path to A.C. ground. This low impedance path to A.C. ground acts both as a signal bypass to ground and as degenerative feedback impedance for A.C. stability of the amplifier. As shown in FIG. 2, the low impedance path is across the emitter-to-base junction and emitter-to-collector path of a second transistor Q2. That is, the emitter lead of transistor Q2 is connected to the circuit point 10 and the base lead of transistor Q2 is connected to receive the bias voltage $V_b$ at circuit point 20. The transistor Q2 collector lead is connected to receive a further bias voltage $V_{c2}$. Thus, both the base lead and the collector lead are essentially A.C. ground for time varying signals since the bias voltages $V_b$ and $V_{c2}$ are bypassed by suitable capacitor means (not shown). A further clamp diode CR2 is provided between the collector lead of transistor Q1 and the $V_{c2}$ bias voltage for the purpose of preventing saturation of transistor Q1.

The amplifier is thus single-ended. That is, the input signals are applied to the transistor Q1 base lead relative to circuit ground. The amplifier operation is linear or class A and the anti-saturation diode CR2 permits the amplifier to receive large amplitude input signals without saturating. The common emitter resistor $R_{EE}$ and the $V_e$ bias voltage simulate a substantially constant current source. In the standby or quiescent condition, the constant current flowing in common emitter resistor $R_{EE}$ divides equally such that half flows in the emitter lead of transistor Q1 and the other half flows in the emitter lead of transistor Q2. When a signal is applied to the base lead of transistor Q1, its emitter current either increases or decreases depending upon whether the input signal is positive or negative going, and the emitter current of transistor Q2 decreases or increases by a corresponding amount. There is a corresponding increase or decrease, as the case may be, in the collector current of transistor Q1 resulting in either a negative going output signal (for a positive going input signal) at output lead OL which is clamped by diode CR2 to a relatively low (LO) voltage level, or a positive going signal (for a negative going input signal) which is clamped by diode CR1 to a relatively high (HI) voltage level.

In the absence of a signal (standby condition), the output voltage at lead OL has a value about midway between the HI and LO levels such that neither of the diodes CR1 and CR2 conducts.

In one typical design for the circuit, the voltages have the following values: $V_{c1}=+10$ volts, $V_{c2}=-1.1$ volts, $V_e=-30$ volts, and $V_b=-5$ volt. For $V_{c2}=-1.1$ volts, the HI and LO output signal levels are $-0.8$ volt and $-1.8$ volts, respectively, which are compatible with presently available current mode logic (CML) circuits, such as the RCA CD 2100. Accordingly, the amplifier may then drive such CML circuits.

The signal voltage at point 10 is essentially bypassed to A.C. ground by way of the low impedance path across the emitter-to-base junction and the emitter-to-collector path of transistor Q2. This impedance $Z_{12}$ (the impedance between point 10 and A.C. ground) is dependent only on the internal parameters of transistor Q2 and is given by $$Z_{12}=r_{e2}+\frac{r_{bb2}'}{\beta_2} \quad (1)$$

where:

$r_{e2}$ is the emitter diode resistance of Q2,
$r_{bb2}'$ is the base spreading resistance of Q2, and
$\beta_2$ is the current amplification factor of the transistor Q2.

The impedance $Z_{12}$ is relatively small, of the order of 8 ohms or so. In addition to providing the signal bypass function, $Z_{12}$ also serves as a degenerative feedback impedance to provide A.C. stability for the transistor Q1 amplifier.

The relatively small value of $Z_{12}$ does not severely limit the gain and bandwidth of the amplifier. The gain G of the amplifier is given by $$G=\frac{\beta_1 R_C}{Z_{in}} \quad (2)$$

where:

$\beta_1$ is the current amplification factor of transistor Q1,
$R_C$ is the collector resistor, and
$Z_{in}$ is the input impedance between the transistr Q1 base lead and circuit ground.

The impedance $Z_{in}$ is given by $$Z_{in}=r_{bb1}'+\beta_1(r_{e1}+Z_{12}) \quad (3)$$

where:

$r_{bb1}'$ is the base spreading resistance of Q1,
$\beta_1$ is the current amplification factor of transistor Q1,
$r_{e1}$ is the emitter diode resistance of Q1, and
$Z_{12}$ is given by Equation 1.

Typical circuit designs have yielded gains on the order of 100 to 120 for $Z_{12}\cong 8$ ohms. It is to be noted that if the collector leads of transistor Q2 were not at A.C. ground (as, for example, a collector resistor connected to transistor Q2), the impedance $Z_{12}$ would be larger and the gain smaller. Such circuit designs have proved adequate to detect input signals as small as 15 millivolts and as large as 750 millivolts.

Although the invention has been illustrated with NPN type transistors, PNP transistors may also be employed so long as the diode polarities and bias voltages are appropriately changed.

What is claimed is.

1. The combination comprising:

first and second transistors, each having base, collector and emitter leads, a collector impedance and a common emitter impedance, means for coupling the emitter leads of both transistors to the common emitter impedance and for coupling the first transistor collector lead to the collector impedance, input signal means connected across the base leads of the transistors and adapted to apply input signals thereacross, and operating power means including separate connections to the free ends of the collector and common emitter impedances and low A.C. impedance connections from the base and collector leads of the second transistor to ground for establishing A.C. ground conditions at the base and collector leads of the second transistor, whereby the emitter-to-base junction and emitter-to-collector path of the second transistor provide a relatively low impedance path to A.C. ground for time varying signals.

2. The invention as set forth in claim 1 wherein said operating power means further includes voltage source means for biassing both transistors for class A operation.

3. The invention as set forth in claim 2
wherein said transistors are of the same conductivity type, and
wherein output lead means is coupled to the first transistor collector lead.

4. In a linear, high gain, wideband amplifier which includes a pair of transistors having their emitter leads commonly coupled in circuit with a current source, their base leads connected to receive input signals thereacross, and a collector impedance connecting the collector lead of one of the transistors in circuit with operating power means, the improvement which comprises:
means included in said operating power means for providing A.C. ground conditions at the base and collector leads of the other transistor, whereby the emitter-to-base junction and collector-to-emitter path of the other transistor provide a relatively low impedance path to A.C. ground for time varying signals.

5. In combination:
a first transistor having base, collector and emitter electrodes;
a current source connected between said emitter and collector electrodes for supplying operating current to said transistor; and
means for maintaining the emitter electrode of said first transistor essentially at alternating voltage ground potential including a second transistor having base, collector and emitter electrodes, connected at its emitter electrode to the emitter electrode of said first transistor, and means for maintaining the collector and base electrodes of said second transistor at different fixed direct potentials and at alternating voltage ground potential.

6. The combination claimed in claim 5, further including a pair of diodes connected anode-to-cathode, connected between the collector electrodes of said first and second transistors.

7. In combination:
first and second transistors, each having base, collector and emitter electrodes;
a source of operating potential;

an emitter impedance directly connecting one terminal of said source to the emitter electrodes of both of said transistors;
a collector impedance directly connecting the other terminal of said source to the collector electrode of said first transistor;
means for applying a direct operating voltage to the collector electrode of said second transistor;
means for applying a direct forward bias voltage to the base electrode of said second transistor;
means for maintaining the collector and base electrodes of said second transistor at alternating voltage ground to thereby maintain both emitter electrodes also at alternating voltage ground; and
means for applying a signal voltage to the base electrode of the first transistor.

8. An amplifier comprising, in combination:
a first transistor having emitter, base and collector electrodes;
a current source connected between said emitter and collector electrodes for supplying operating current to said transistor; and
an alternating current, low impedance bypass circuit connecting said emitter electrode to ground comprising:
a second transistor having emitter, base and collector electrodes, directly connected at its emitter electrode to the emitter electrode of said first transistor and connected via low alternating voltage impedance to ground at its base and collector electrodes; and
means for biasing said second transistor to conduct a portion of the current from said current source.

References Cited

UNITED STATES PATENTS

| | | | |
|---|---|---|---|
| 3,364,434 | 1/1968 | Widlar | 330—22 |
| 3,432,689 | 3/1969 | Pratt | 330—14 X |
| 3,460,049 | 8/1969 | Wittmann | 330—22 X |

ROY LAKE, Primary Examiner

S. H. GRIMM, Assistant Examiner

U.S. Cl. X.R.

330—40